Figure 1:
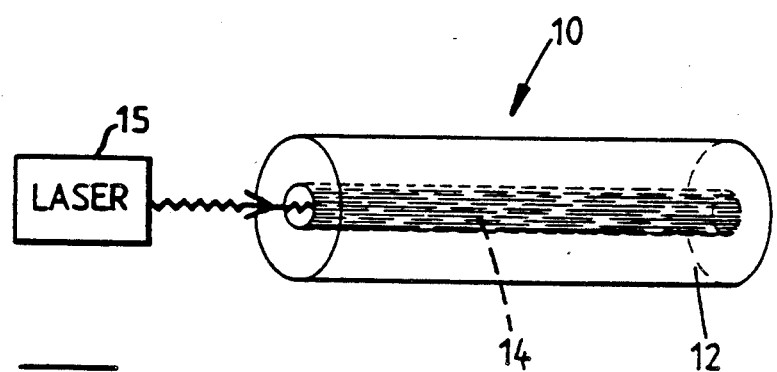

United States Patent [19]

Lo

[11] Patent Number: 4,995,699

[45] Date of Patent: Feb. 26, 1991

[54] ELECTRICALLY CONDUCTIVE SOLUTION COMPRISED OF CHARGED BOSON IONS

[75] Inventor: Shui-Yin Lo, Sherman Oaks, Calif.

[73] Assignee: Apricot S.A., Notre-Dame, Luxembourg

[21] Appl. No.: 118,709

[22] Filed: Nov. 9, 1987

[51] Int. Cl.$^5$ .............................................. G02B 6/20
[52] U.S. Cl. ............................... 350/96.32; 174/9 F; 174/125.1; 350/96.34; 372/51; 372/705; 505/866; 505/887
[58] Field of Search ............... 350/96.1, 96.15, 96.23, 350/96.29, 96.3, 96.32, 96.34; 372/39, 40, 41, 51, 54, 705; 174/1, 9 F, 126 S; 505/800, 801, 866, 884, 887

[56] References Cited

U.S. PATENT DOCUMENTS

| | | | |
|---|---|---|---|
| 4,009,382 | 2/1977 | Nath | 350/96.32 X |
| 4,626,792 | 12/1986 | Liboff et al. | 372/43 X |
| 4,747,662 | 5/1988 | Fitz | 350/96.32 |

*Primary Examiner*—John D. Lee
*Attorney, Agent, or Firm*—Ladas & Parry

[57] ABSTRACT

Electrical conductor comprising a glass fibre (12) with a hollow center within which is a liquid solution (14) containing D$^+$ or other boson ions. Coherent light from a laser (15) is directed into the solution to render the boson ions coherent, inducing a superconducting state. In another embodiment, the laser is replaced by a microwave source.

63 Claims, 1 Drawing Sheet

ELECTRICALLY CONDUCTIVE SOLUTION COMPRISED OF CHARGED BOSON IONS

All present commercially available superconductors operate below 20° K. This temperature is generally attainable only by using liquid helium. Liquid helium is expensive, and hard to maintain. The attainment of a material which is superconductive at room temperatures, is obviously desirable and considerable speculation and research has been directed towards achieving this end. For example, it has been proposed to utilize large organic molecules which will become superconducting at room temperature.

Broadly, the invention provides an electrical conductor comprising a solution containing charged boson ions, and means confining the solution and permitting application of electric potential thereto for current flow through the solution. The conductivity properties may be improved by subjecting the solution to electromagnetic waves such as laser light or microwave radiation. By suitable application of such electromagnetic waves, a superconducting state may be induced.

In accordance with one form of the present invention, there is provided a superconducting device comprising means containing a liquid containing conducting bosons having integer spin and capable of undergoing boson condensation, and coherence-inducing means for rendering the bosons coherent. The coherence-inducing means may comprise a laser arranged to direct coherent light into the liquid. This may be effective to induce coherence by the process of induced scattering. A suitable boson is deuterium ($D^+$). The liquid may comprise a solution, and may comprise, for example, a heavy water solution such as a solution of a salt such as NaCl in heavy water. The liquid may comprise an acid or solution thereof in which the hydrogen of the acid is replaced by deuterium ($D^+$).

Insofar as the application of the invention to form superconductors is concerned, all known superconductors utilize electron pairs (often called "Cooper pairs") as a mediator of conducting. Electrons occur naturally in all metals and conductors and conduct electricity. However, electrons are half integer spin ($\frac{1}{2}\hbar$) objects and, being fermions and not bosons, they cannot undergo boson condensation and become coherent. Hence, what is required is two electrons ($e^-e^-$), or an electron pair, to form an integer spin object, and to become coherent. Once sufficient pairs become coherent, they will conduct electricity without friction. Electrons, however, are negative and repel each other. It is rather difficult for them to form a pair. A small amount of disturbance, such as thermal noise, will destroy the pairing, and coherence will be lost. This is the reason why a very low temperature is generally needed to maintain the electron pairs, and the superconductivity, in conventional superconductors.

Because of the above difficulty it is proposed, in accordance with one aspect of this invention, to form a superconducting material utilizing conducting objects, which have integer spin (e.g. $1\hbar$), are bosons, and can undergo boson condensation. More particularly, the $D^+$ deuterium ion may comprise such an object. Deuterium ions ($D^+$) occur naturally in any conducting heavy water. Ordinary salty water ($H_2O+NaCl$) or acids (such as HCl) conduct electricity very well. One of the ions in such an ordinary water-salt solution is $H^+$ (i.e. a proton) which has also half integer spin, and hence cannot undergo boson condensation. However, by replacing the water component of the salty water with heavy water (i.e. replacing $H^+$ by $D^+$) one arrives at a conducting medium which is mediated by particles like $D^+$ with integer spin and can undergo boson condensation. Replacement of the $H^+$ component in an acid (such as HCl) with $D^+$ will achieve the same result.

Contrary to the physics of solids and gases, the physics of liquids is less well known. To a zeroth order approximation, the ions in a solution may be regarded as behaving like free gas particles. In this zeroth order approximation, deuterium ions may undergo phase transition, and become coherent. Normally, at room temperature, these ions will move randomly inside the liquid (just as molecules of a gas in a room) travelling at great speed with random direction and bouncing off one another. They are incoherent. However, one may scatter these ions with coherent light from a laser. The induced scattering of ions by coherent light, under suitable condition will cause these ions to become coherent. Instead of randomly scattering off in various directions, these ions will travel coherently in the direction of light. These suitable conditions, particularly the critical condition when coherence occurs, are described in International application No. PCT/AU86/00212 (inventor S. Y. Lo) the disclosures of which are hereby incorporated to form part of the present specification. Generally, an intense light from a laser (say a 100 watt or above $CO_2$ laser) is required, as well as a large density of ions. Once these deuterium ions $D^+$ become coherent, they will conduct electricity without resistance. It is well known that superfluid flows without friction. In similar fashion, these coherent deuterium ions $D^+$ will flow through the liquid without friction, that is to say with no electrical resistance.

On turning off of the laser, coherent light is no longer incident on the $D^+$ ions. The collisions of coherent $D^+$ with other particles in the liquid will likely immediately destroy the coherence, and the superconducting state may be lost. Hence, the superconductor so constructed will only be operative under the influence of applied coherent light.

One may loosely compare the operation of superconductors of this invention with that of presently known superconducting metals, such as niobium alloy, by noting that the latter operate under the influence of liquid helium cooling the electron rich matter, whereas the present invention operates under influence of a laser with cooling caused by induced scattering.

In other embodiments of the invention, the laser is replaced by a suitable alternative source of electromagnetic waves, such as a microwave source.

Figure 2:
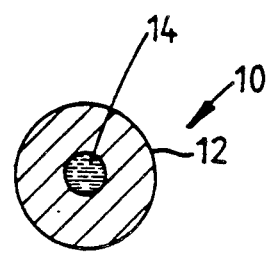

The invention is further described by way of example only with reference to the accompanying drawings in which:

FIG. 1 is a diagrammatic perspective view of a superconducting device constructed in accordance with the invention; and FIG. 2 is a transverse section of the device of FIG. 1.

The device 10 shown consists of a glass fibre 12 with a follow center within which resides an electrolyte solution 14 formed with heavy water. The glass and solution are chosen and prepared to have particular densities, such that they have the same refractive index whereby light can travel freely from the liquid to the glass fibre and vice versa. In this example, coherent light from a laser 15 is directed axially into the hollow center of fibre 12.

Although constructions other than that shown may be used, that described permits holding the solution in place whilst also allowing the light to be bent by the glass fibre, as the glass fibre is itself bent. Also it is simple to provide suitable ohmic terminals at either end of the glass fibre to make electrical contact with the solution 14 for current flow to the solution.

It is also possible that the refractive index of the glass is made slightly less than that of the heavy water solution. Of course, other exterior containers may be employed instead of the described glass fibre. In general a dry hollow container will suffice.

Various practical applications of a superconducting device as described are possible. For example:

(1) The long-distance transmission of electricity from electrical generating plant to consumer may be made free of energy loss by using cables made of the above glass-fibre D+ rich solution.
(2) Magnets. Although magnetic fields do not perform work, the generation of magnetic fields nonetheless normally consumes energy because of the existence of electrical resistance. By using the above superconducting device, one can construct superconducting magnets which are operative at room temperature. Ordinary superconducting magnets made of Niobium alloy are used extensively, but must operate under liquid helium temperature. Fibre glass D+ ion superconducting magnets may readily replace these, and will operate at room temperature.
(3) Fibre glass containing D+ ion superconducting material may be used to form cable enabling construction of magnets for the building of magnetically levitated vehicles such as trains or automobiles.

Instead of using laser emitting light of arbitary frequency as discussed above, it is possible to achieve good results using a laser emitting a particular frequency in the infrared range. The frequency, $v$, should be given by $$h v = E_1 - E_o \qquad (1)$$

where h is the Plank constant, $E_o$ is the energy of the ground state of the D+ ions in the deuterated water molecule, and $E_1$ is the energy of the excited level in the vibrational band. By absorbing infrared light at these frequencies, the D+ ion will be elevated to the excited energy level 1 and can tunnel through the potential barrier among the deuterated water molecules more easily. The quantum tunneling effect between two neighboring molecules will greatly increase the mobility of D+ ion among molecules. The conductivity of the solution will greatly increase. If a critical condition, as discussed in International application No. PCT/AU86/00212, is reached, superconductivity will be achieved.

The extreme increase in conductivity may also be achieved by electromagnetic waves at other frequencies than at those achieved by an infrared laser. For example, microwave radiation may be directed toward the solution with D+ ions. The frequency of the microwave should be as given by eq (1) where the energy $E_1$ of the excited level is the energy of the rotational band of the heavy water molecules. The absorption of the microwaves at the proper frequency will make D+ ions in the molecule rotate faster and hence increase greatly the conductivity of the solution.

I claim:

1. An electrical conductor comprising a solution containing charged boson ions, and means confining the solution and permitting application of electric potential thereto for current flow through the solution, said conductor further comprising means for subjecting the solution to electromagnetic waves to render said solution superconducting to said current.

2. An electrical conductor as claimed in claim 1 wherein the charged boson ions comprise D+ ions.

3. An electrical conductor as claimed in claim 2 wherein the ions are, in use of the conductor, caused to effect coherent movement.

4. An electrical conductor as claimed in claim 1 wherein said means for subjecting comprises a laser whereby said electromagnetic waves comprise laser light.

5. An electrical conductor as claimed in claim 4 wherein said means for subjecting generates said laser light as infrared light, effective in use to excite the vibrational levels of the ions.

6. An electrical conductor as claimed in claim 5 wherein the ions are, in use of the conductor, caused to effect coherent movement.

7. An electrical conductor as claimed in claim 4 wherein the ions are, in use of the conductor, caused to effect coherent movement.

8. An electrical conductor as claimed in claim 1 wherein said means for subjecting comprises means for generating microwave radiation which comprises said waves.

9. An electrical conductor as claimed in claim 8 wherein said means generates said microwave radiation at an energy required for the ions to be excited in the rotational band.

10. An electrical conductor as claimed in claim 9 wherein the ions are, in use of the conductor, caused to effect coherent movement.

11. An electrical conductor as claimed in claim 8 wherein the ions are, in use of the conductor, caused to effect coherent movement.

12. An electrical conductor as claimed in claim 1 wherein the ions are, in use of the conductor, caused to effect coherent movement.

13. An electrical conductor as claimed in claim 12 wherein the frequency of said electromagnetic waves is substantially defined as:

$$\hbar v = E_1 - E_0$$

where $\hbar$ is the Plank constant, $E_o$ is the energy of the ground state of the ions, $E_1$ is the energy of the excited level in a vibrational band induced by the incidence of the waves, and $v$ is the frequency.

14. An electrical conductor as claimed in claim 1 wherein the ions are, in use of the conductor, caused to effect coherent movement.

15. An electrical conductor as claimed in claim 1 further comprising means for subjecting the solution to electromagnetic waves.

16. An electrical conductor as claimed in claim 15 wherein said means for subjecting comprises a laser, whereby said electromagnetic waves comprise laser light.

17. An electrical conductor as claimed in claim 16 wherein the ions are, in use of the conductor, caused to effect coherent movement.

18. An electrical conductor as claimed in claim 15 wherein said means for subjecting comprises means for generating microwave radiation which comprises said waves.

19. An electrical conductor as claimed in claim 18 wherein said means for subjecting generates laser light as infrared light, effective in use to excite the vibrational levels of the ions.

20. An electrical conductor as claimed in claim 19 wherein the ions are, in use of the conductor, caused to effect coherent movement.

21. An electrical conductor as claimed in claim 18 wherein said means for generating microwave radiation generates said microwave radiation in an energy required for the ions to be excited in the rotational band of the molecule.

22. An electrical conductor as claimed in claim 21 wherein the ions are, in use of the conductor, caused to effect coherent movement.

23. An electrical conductor as claimed in claim 18 wherein the ions are, in use of the conductor, caused to effect coherent movement.

24. An electrical conductor as claimed in claim 15 wherein the ions are, in use of the conductor, caused to effect coherent movement.

25. A superconducting device comprising means containing a liquid containing conducting bosons having integer spin and capable of undergoing boson conduction, and coherence-inducing means for rendering the bosons coherent.

26. A superconducting device as claimed in claim 25 wherein said coherence-inducing means comprises a source of electromagnetic waves.

27. A superconducting device as claimed in claim 26 wherein said source comprises a laser arranged to direct coherent light into the liquid.

28. A superconducting device as claimed in claim 27 wherein said bosons are $D^+$ ions.

29. A superconducting device as claimed in claim 28 wherein said liquid comprises a heavy water solution.

30. A superconducting device as claimed in claim 29 wherein said solution is a solution of salt in said heavy water.

31. A superconducting device as claimed in claim 29 wherein the frequency of said electromagnetic waves is substantially defined as:

$$h\nu = E_1 - E_0$$

where h is the Planck constant, $E_0$ is the energy of the ground state of the bosons, $E_1$ is the energy of the excited level in a vibrational band induced by the incidence of the waves, and $\nu$ is the frequency.

32. A superconducting device as claimed in claim 30 wherein said salt is NaCl.

33. A superconducting device as claimed in claim 30 wherein the frequency of said electromagnetic waves is substantially defined as:

$$h\nu = E_1 - E_0$$

where h is the Planck constant, $E_0$ is the energy of the ground state of the bosons, $E_1$ is the energy of the excited level in a vibrational band induced by the incidence of the waves, and $\nu$ is the frequency.

34. A superconducting device as claimed in claim 32 wherein said liquid comprises an acid or solution thereof in which the hydrogen in the acid is replaced by deuterium ($D^+$).

35. A superconducting device as claimed in claim 34 wherein the frequency of said electromagnetic waves is substantially defined as:

$$h\nu = E_1 E_0$$

where h is the Planck constant, $E_0$ is the energy of the ground state of the bosons, $E_1$ is the energy of the excited level in a vibrational band induced by the incidence of the waves, and $\nu$ is the frequency.

36. A superconducting device as claimed in claim 32 wherein the frequency of said electromagnetic waves is substantially defined as:

$$h\nu = E_1 E_0$$

where h is the Planck constant, $E_0$ is the energy of the ground state of the bosons, $E_1$ is the energy of the excited level in a vibrational band induced by the incidence of the waves, and $\nu$ is the frequency.

37. A superconducting device as claimed in claim 28 wherein the frequency of said electromagnetic waves is substantially defined as:

$$h\nu = E_1 - E_0$$

where h is the Planck constant, $E_0$ is the energy of the ground state of the bosons, $E_1$ is the energy of the excited level in a vibrational band induced by the incidence of the waves, and $\nu$ is the frequency.

38. A superconducting device as claimed in claim 21 wherein the frequency of said electromagnetic waves is substantially defined as:

$$h\nu = E_1 E_0$$

where h is the Planck constant, $E_0$ is the energy of the ground state of the bosons, $E_1$ is the energy of the excited level in a vibrational band induced by the incidence of the waves, and $\nu$ is the frequency.

39. A superconducting device as claimed in claim 26 wherein said source comprises a microwave source.

40. A superconducting device as claimed in claim 39 wherein said source generates microwave radiation at an energy required for the bosons to be excited in the rotational band of the molecule.

41. A superconducting device as claimed in claim 39 wherein said bosons are $D^+$ ions.

42. A superconducting device as claimed in claim 41 wherein said source generates microwave radiation at an energy required for the bosons to be excited in the rotation band of the molecule.

43. A superconducting device as claimed in claim 41 wherein said liquid comprises a heavy water solution.

44. A superconducting device as claimed in claim 43 wherein said source generates microwave radiation at an energy required for the bosons to be excited in the rotational band of the molecule.

45. A superconducting device as claimed in claim 43 wherein said solution is a solution of salt in said heavy water.

46. A superconducting device as claimed in claim 45 wherein said source generates microwave radiation at an energy required for the bosons to be excited in the rotational band of the molecule.

47. A superconducting device as claimed in claim 45 wherein said salt is NaCl.

48. A superconducting device as claimed in claim 47 wherein said source generates microwave radiation at an energy required for the bosons to be excited in the rotational band of the molecule.

49. A superconducting device as claimed in claim 41 wherein said liquid comprises an acid or solution thereof in which the hydrogen in the acid is replaced by deuterium (D+).

50. A superconducting device as claimed in claim 49 wherein said source generates microwave radiation at an energy required for the bosons to be excited in the rotational band of the molecule.

51. A superconducting device as claimed in claim 49 wherein:

$$h\nu = E_1 E_0$$

where $h$ is the Planck constant, $E_0$ is the energy of the ground state of the bosons, $E_1$ is the energy of the excited level in a vibrational band induced by the incidence of the waves, and $\nu$ is the frequency.

52. A superconducting device as claimed in claim 49 wherein the frequency of said electromagnetic waves is substantially defined as:

$$h\nu = E_1 - E_0$$

where $h$ is the Plank constant, $E_0$ is the energy of the ground state of the ions, $E_1$ is the energy of the excited level in a vibrational band induced by the incidence of the waves, and $\nu$ is the frequency.

53. A superconducting device as claimed in claim 26 wherein said bosons are D+ ions.

54. A superconducting device as claimed in claim 53 wherein said liquid comprises a heavy water solution.

55. A superconducting device as claimed in claim 54 wherein said solution is a solution of salt in said heavy water.

56. A superconducting device as claimed in claim 54 wherein the frequency of said electromagnetic waves is substantially defined as:

$$h\nu = E_1 - E_0$$

where $h$ is the Planck constant, $E_0$ is the energy of the ground state of the bosons, $E_1$ is the energy of the excited level in a vibrational band induced by the incidence of the waves, and $\nu$ is the frequency.

57. A superconducting device as claimed in claim 55 wherein said salt is NaCl.

58. A superconducting device as claimed in claim 55 wherein the frequency of said electromagnetic waves is substantially defined as:

$$h\nu = E_1 - E_0$$

where $h$ is the Planck constant, $E_0$ is the energy of the ground state of the bosons, $E_1$ is the energy of the excited level in a vibrational band induced by the incidence of the waves, and $\nu$ is the frequency.

59. A superconducting device as claimed in claim 57 wherein said liquid comprises an acid or solution thereof in which the hydrogen in the acid is replaced by deuterium (D+).

60. A superconducting device as claimed in claim 59 wherein the frequency of said electromagnetic waves is substantially defined as:

$$h\nu = E_1 - E_0$$

where $h$ is the Planck constant, $E_0$ is the energy of the ground state of the bosons, $E_1$ is the energy of the excited level in a vibrational band induced by the incidence of the waves, and $\nu$ is the frequency.

61. A superconducting device as claimed in claim 57 wherein the frequency of said electromagnetic waves is substantially defined as:

$$h\nu = E_1 - E_0$$

where $h$ is the Planck constant, $E_0$ is the energy of the ground state of the bosons, $E_1$ is the energy of the excited level in a vibrational band induced by the incidence of the waves, and $\nu$ is the frequency.

62. A superconducting device as claimed in claim 53 wherein the frequency of said electromagnetic waves is substantially defined as:

$$h\nu = E_1 - E_0$$

where $h$ is the Planck constant, $E_0$ is the energy of the ground state of the bosons, $E_1$ is the energy of the excited level in a vibrational band induced by the incidence of the waves, and $\nu$ is the frequency.

63. A superconducting device as claimed in claim 26 wherein the frequency of said electromagnetic waves is substantially defined as:

$$h\nu = E_1 - E_0$$

where $h$ is the Planck constant, $E_0$ is the energy of the ground state of the bosons, $E_1$ is the energy of the excited level in a vibrational band induced by the incidence of the waves, and $\nu$ is the frequency.

* * * * *